United States Patent
Reusswig et al.

(10) Patent No.: US 10,998,073 B2
(45) Date of Patent: May 4, 2021

(54) SYSTEMS AND METHODS TO WAKE UP MEMORY ARRAY

(71) Applicant: Western Digital Technologies, Inc., San Jose, CA (US)

(72) Inventors: Phil Reusswig, San Jose, CA (US); Sahil Sharma, San Jose, CA (US); Gautam Dusija, San Jose, CA (US)

(73) Assignee: Western Digital Technologies, Inc., San Jose, CA (US)

(*) Notice: Subject to any disclaimer, the term of this patent is extended or adjusted under 35 U.S.C. 154(b) by 38 days.

(21) Appl. No.: 16/289,649

(22) Filed: Feb. 28, 2019

(65) Prior Publication Data

US 2020/0279611 A1    Sep. 3, 2020

(51) Int. Cl.
| | |
|---|---|
| *G11C 29/04* | (2006.01) |
| *G06F 1/3234* | (2019.01) |
| *G11C 5/14* | (2006.01) |
| *G11C 11/4072* | (2006.01) |

(52) U.S. Cl.
CPC ............ *G11C 29/04* (2013.01); *G06F 1/3275* (2013.01); *G11C 5/148* (2013.01); *G11C 11/4072* (2013.01); *G11C 2029/0407* (2013.01); *G11C 2207/2236* (2013.01)

(58) Field of Classification Search
CPC ..... G11C 29/04; G11C 11/4072; G11C 5/148; G11C 2029/0407; G11C 2207/2236; G06F 1/3275

USPC ........................................................ 714/764
See application file for complete search history.

(56) References Cited

U.S. PATENT DOCUMENTS

| | | | |
|---|---|---|---|
| 9,857,864 B1* | 1/2018 | Thoppay Egambaram ................. G06F 1/3275 |
| 10,095,303 B2* | 10/2018 | Ahn ..................... G06F 12/0246 |
| 2007/0094454 A1* | 4/2007 | Brundula ................ G06F 12/06 711/154 |
| 2007/0260867 A1* | 11/2007 | Ethier .................... G06F 9/4418 713/2 |
| 2008/0126816 A1* | 5/2008 | Prete .................... G06F 13/1673 713/323 |
| 2016/0365127 A1* | 12/2016 | Chun ....................... G11C 7/20 |
| 2018/0067539 A1* | 3/2018 | Samson ................... G11C 7/22 |
| 2019/0079575 A1* | 3/2019 | Hanson ................. G06F 1/3237 |
| 2019/0392376 A1* | 12/2019 | Jia .......................... H04W 4/38 |

* cited by examiner

*Primary Examiner* — James C Kerveros
(74) *Attorney, Agent, or Firm* — Vierra Magen Marcus LLP

(57) ABSTRACT

Disclosed is an apparatus including a memory device. The memory device includes a memory array, a number of non-volatile memory sections configured to store a copy of operational information for the memory array, and a controller coupled to the number of non-volatile memory sections. The controller can responsive to a first wake-up operation, select a first non-volatile memory section as a starting section to retrieve the copy of operational information. The controller can responsive to a second wake-up operation, select a second non-volatile memory section as the starting section to retrieve the copy of operational information without regard to success of a prior attempt to retrieve the copy of operational information.

20 Claims, 8 Drawing Sheets

SYSTEMS AND METHODS TO WAKE UP MEMORY ARRAY

BACKGROUND

The following description is provided to assist the understanding of the reader. None of the information provided is admitted to be prior art.

Non-volatile data storage devices, such as embedded memory devices (e.g., embedded MultiMedia Card (eMMC) devices) and removable memory devices (e.g., removable universal serial bus (USB) flash memory devices and other removable storage cards), have allowed for increased portability of data and software applications. Users of non-volatile data storage devices increasingly rely on the non-volatile storage devices to store and provide rapid access to a large amount of data.

To optimize power management of the non-volatile data storage devices, the non-volatile data storage devices typically transition to one or more low-power states when the non-volatile data storage devices are not actively functioning. During such low-power states, one or more components of the non-volatile data storage devices (e.g., memory arrays that store data) are powered off. To optimize performance (e.g., latency, speed, etc.) of the non-volatile data storage devices, the memory arrays are generally required to transition out of the low-power states to be ready to function (e.g., read, write). The process to transition (e.g., wake up) the memory arrays out of the low-power states are sometimes referred to as a "Power-On-Reset" (POR) process.

Existing non-volatile data storage devices generally perform such a POR process by retrieving operational and/or configuration information of the memory array from a number of read-only memory (ROM) blocks. In particular, the existing non-volatile data storage devices appear to always use a particular ROM block as a starting block to retrieve the information, and wait until the particular ROM block fails in finishing the POR process to move on to another ROM block for continuing the POR process. Always using a same starting ROM block to perform the POR process can cause various issues such as, for example, cumulative read disturb (RD) in that particular ROM block, which in turn can deteriorate the performance of the non-volatile data storage devices. Thus, the existing non-volatile data storage devices are not entirely satisfactory.

SUMMARY

Various embodiments are related to a device. The device includes a memory array, a number of non-volatile memory sections configured to store a copy of operational information for the memory array, and a controller coupled to the number of non-volatile memory sections. The controller can select a first non-volatile memory section as a starting section to retrieve the copy of operational information in connection with a first wake-up operation. The controller can select a second non-volatile memory section as the starting section to retrieve the copy of operational information in connection with a second wake-up operation without regard to success of a prior attempt to retrieve the copy of operational information.

In one or more embodiments, the controller can switch between selection of the first non-volatile memory section and the second non-volatile memory sections as the starting section for each successive wake-up operation.

In one or more embodiments, the wake-up operation transitions the memory array out of at least one of a power-saving state and a power-off state.

In one or more embodiments, the controller can further deterministically select one of the first non-volatile memory section and the second non-volatile memory section in response to receiving a plane address that designates the one of the first non-volatile memory section and the second non-volatile memory section.

In one or more embodiments, the controller can randomly select the first non-volatile memory section and the second non-volatile memory section from the number of non-volatile memory sections in connection with the first and second wake-up operations, respectively.

In one or more embodiments, the first non-volatile memory section and second non-volatile memory section each include a number of one-time-programmable memory cells.

In one or more embodiments, the operational information indicates at least one of a bad column of the memory array, a bad block of the memory array, and an operating parameter of the memory array.

In one or more embodiments, the controller can proactively switch between selection of the first non-volatile memory section and the second non-volatile memory section as the starting section to increase speed and decrease latency of operation of the memory array.

In one or more embodiments, the controller can further count a number of wake-up operations using the copy of operational information stored in the first non-volatile memory section that fail to transition the memory array out of a low-power state. The controller can further select the second non-volatile memory section as the starting section in response to determining that the number of wake-up operations satisfies a predefined threshold.

Various embodiments disclosed herein are related to a method. The method includes receiving a command to transition a memory array out of a low-power state, wherein the command includes an indication of a first set of non-volatile memory cells. The method includes based on the indication, retrieving operational information of the memory array from the first set of non-volatile memory cells information. The method includes using the retrieved operational information stored in the first set of non-volatile memory cells to access the memory array.

In one or more embodiments, the indication comprises a plane address that designates the first set of non-volatile memory cells, and wherein the method further comprises selecting the first set of non-volatile memory cells according to the plane address.

In one or more embodiments, the method further includes receiving a second command to transition the memory array out of another low-power state. The second command indicates a second, different set of non-volatile memory cells. The method further includes responsive to the second command, retrieving operational information from the second, different set of non-volatile memory cells. The method further includes using the retrieved operational information stored in the second, different set of non-volatile memory cells to access the memory array.

In one or more embodiments, the method further includes receiving a number of successive commands to transition the memory array out of respective low-power states. Each of the number of commands indicates either the first or the second, different set of non-volatile memory cells. The method further includes retrieving the operational information of the memory array from either the first or the second, different set of non-volatile memory cells according to the number of successive commands. The method further includes using the selected operational information stored in either the first set of non-volatile memory cells or the second, different second set of non-volatile memory cells to access the memory array.

Various embodiments disclosed herein are related to a device. The device includes a non-volatile memory array. The device includes a first memory section and a second memory section. Each of the first and second memory sections is configured to store a copy of operational information of the non-volatile memory array. The device includes a selector configured to toggle between the first memory section and the second memory section in successive power-on-reset operations to select one of the first memory section and the second memory section. The device includes a controller coupled to the selector. The controller is configured to retrieve the respective copy of operational information from the selected one of the first memory section and the second memory section.

In one or more embodiments, the selector is further configured to select the first memory section in response to operating the non-volatile memory array in a first power-on-reset operation of the successive power-on-reset operations. The selector is further configured to switch to the second memory section in response to operating the non-volatile memory array in a second successive power-on-reset operation of the successive power-on-reset operations.

In one or more embodiments, the selector is further configured to select one of the first memory section or the second memory section in response to receiving a plane address that designates the one of the first memory section or the second memory section.

In one or more embodiments, the operational information indicates at least one of a bad column of the non-volatile memory array, a bad block of the non-volatile memory array, and an operating parameter of the non-volatile memory array.

In one or more embodiments, the controller is further configured to load the copy of operational information stored in either the first memory section or the second memory section into a register circuit to isolate an indicated bad block of the non-volatile memory array from being accessed.

In one or more embodiments, the controller is further configured to load the copy of operational information stored in either the first memory section or the second memory section into a register circuit to replace an indicated bad column of the non-volatile memory array with a corresponding replacement column of the non-volatile memory array.

In one or more embodiments, the controller is further configured to load the copy of operational information stored in either the first memory section or the second memory section into a register circuit to provide a trimmed voltage to operate the non-volatile memory array.

The foregoing summary is illustrative and is not intended to be in any way limiting. In addition to the illustrative aspects, embodiments, and features described above, further aspects, embodiments, and features will become apparent by reference to the following drawings and the detailed description.

Figure 1:
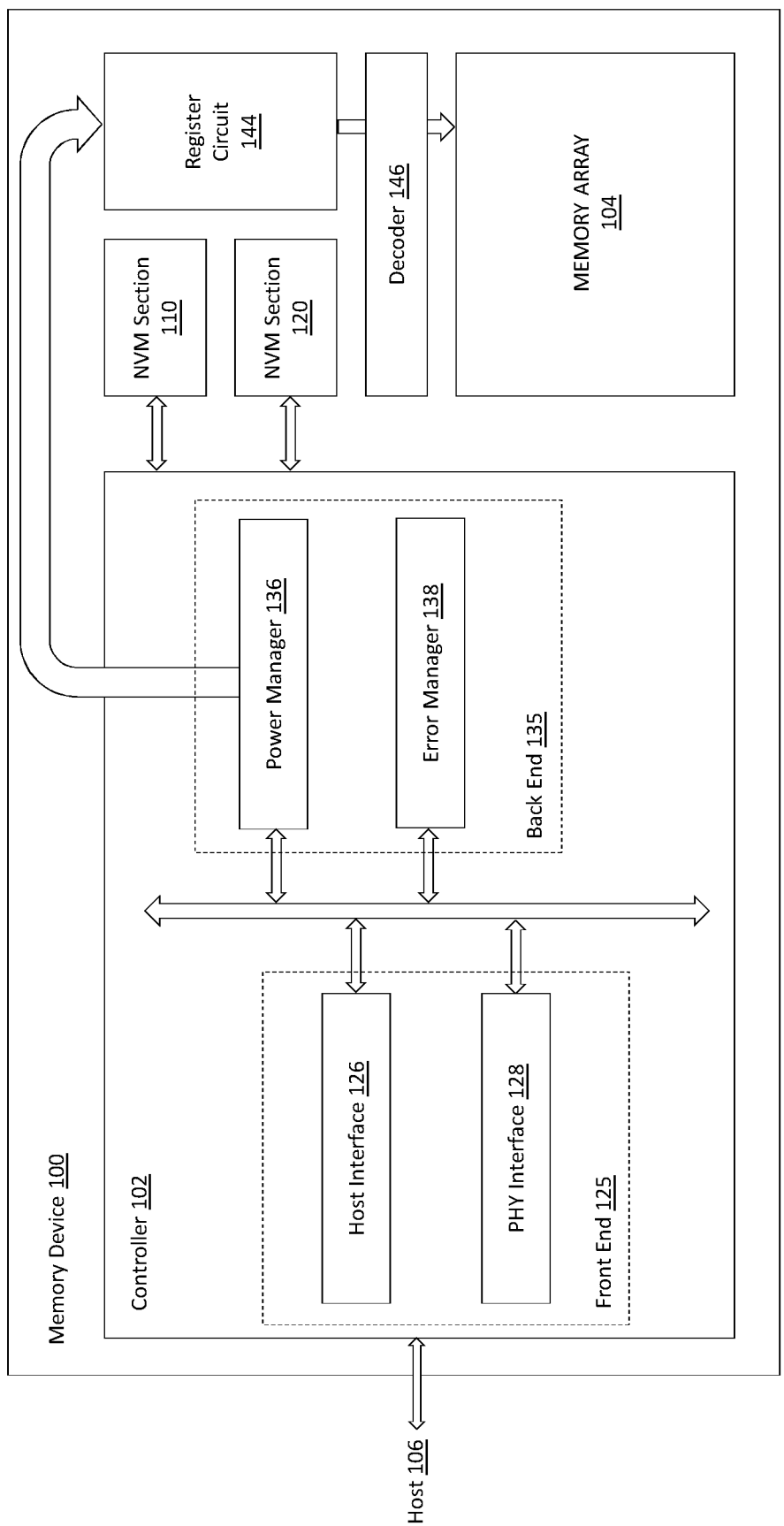
FIG. 1 is a block diagram of a memory device including a controller according to an example embodiment.

The foregoing and other features of the present disclosure will become apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

Various embodiments disclosed herein are related to a memory device that can deterministically and/or randomly use one of various memory sections to perform each of successive wake-up operations on a memory array. A wake-up operation, as used herein, is any command, instruction, signal, trigger, set of commands, instructions, or signals, mode transition, designed to cause a memory array or one or more components of a memory device to transition out of a low-power state to a higher power state. Such a wake-up operation may include a power-on-reset operation as discussed above. A low-power state is a power mode or state in which the memory device and/or certain components of the memory device operate with less than full power and/or no power. A non-volatile memory section, as used herein, is any grouping of memory cells configured to retain data stored in the memory cells when a primary power source is removed. A non-volatile memory section comprises a group of memory cells uniquely identifiable by an address, identifier, or specific signal. In one embodiment, the non-volatile memory section is a group of non-volatile memory cells within a memory array of non-volatile memory cells. In another embodiment, the non-volatile memory section is a group of volatile memory cells coupled to an auxiliary power source configured to maintain data stored in the volatile memory cells when a primary power source is off. Examples of a non-volatile memory section may include a physical page of non-volatile memory cells, a word line of non-volatile memory cells, a bit line of interconnected non-volatile memory cells, an erase block of non-volatile memory cells, a partition, or the like. A non-volatile memory section may comprise non-volatile memory cells within or outside a memory array of the memory device on which wake-up operations are performed.

In some embodiments, the non-volatile memory sections may each include a number of read-only memory cells configured to store one or more copies of operational information for the memory array such that the operational information, once written into the non-volatile memory sections, cannot be changed or tampered with. The operational information may include various information used to operate the memory array in an effective and efficient manner. The values for the variables, parameters, and/or settings of the operational information may be defined by engineers that designed the memory array, by tests performed during fabrication of each memory array, or by other techniques known to those of skill in the art. For example, the operational information may include how columns and/or blocks of the memory array are physically configured, where previously identified bad columns and/or blocks of the memory array are located, where corresponding replacement columns and/or blocks for the bad columns and/or blocks are located, timing information for application of bias voltages, one or more operating parameters (e.g., trimmed voltages) of the memory array, and the like. A copy of operational information comprises a set of data that represents the variables, parameters, and/or settings and corresponding values of the operational information. In certain embodiments, one set of data representing the operational information may comprise the master set of data or original set of data. The master set of data may be stored or generated when a memory array is fabricated. Copies of the mater set of data representing the operational information may be created and stored within one or more non-volatile memory sections of a device, a storage device, a memory die, or the like. These copies of data representing the operational information are referred to herein as "a copy of operational information".

In some embodiments, a wake-up operation is a task that the memory device executes to transition the memory device or a memory array of the memory device out of a low-power state to a higher power state. Such a wake-up operation may include a number of steps. To transition the memory array out of the low-power state, the memory device may initiate a wake-up operation, for example, in response to receiving a command or signal that initiates the wake-up operation (i.e., prior to performing any steps of the wake-up operation). In another example, the memory device may transition the memory array out of the low-power state as an initial step of the multiple steps of the wake-up operation. In yet another example, the memory device may transition the memory array out of the low-power state as a middle step of multiple steps of the wake-up operation. In yet another example, the memory device may transition the memory array out of the low-power state as a final step of multiple steps of the wake-up operation. In yet another example, the memory device may transition the memory array out of the low-power state subsequent to performing all other steps of the wake-up operation.

For example, in connection with a first wake-up operation (e.g., at any above-described stage of the first wake-up operation), the memory device includes a controller configured to deterministically or randomly select one of the non-volatile memory sections as a starting section to retrieve the operational information of a memory array stored therein, and use the retrieved operational information to wake up the memory array (e.g., cause the memory array to be ready for further operations). In connection with a second (e.g., successive) wake-up operation (e.g., at any above-described stage of the second wake-up operation), the controller can perform a similar function. By deterministically or randomly selecting one of the non-volatile memory sections as the starting section for each successive wake-up operation, the controller can retrieve the operational information from the selected non-volatile memory section without regard to success of a prior attempt to retrieve the operational information from the selected non-volatile memory section, or failure of a prior attempt to retrieve the operational information from other non-volatile memory sections. In other words, the controller can proactively switch between the number of non-volatile memory sections to retrieve the operational information to wake up the memory array. As such, the speed and the latency of operation of the memory array can be increased and decreased, respectively. Further, since the controller is not required to always retrieve the operational information from a same starting section in connection with each wake-up operation, wear leveling among the number of non-volatile memory sections may be improved and the life of the memory device increased.

FIG. 1 illustrates a block diagram of an embodiment of a memory device 100, in accordance with some embodiments. The memory device 100 includes a controller 102 communicatively coupled to one or more memory structures 104. In general, controller 102 is a device that manages data stored on the memory structure 104 and communicates with a host 106. In some embodiments, controller 102 can communicate with a number of non-volatile memory sections of the memory device 100, e.g., 110 and 120, to retrieve operational information of memory structure 104 so as to format the memory structure 104 to ensure the memory array is operating properly, map out bad memory cells/blocks/columns (the physical unit of storage) of memory structure 104, and allocate spare memory cells/blocks/columns of memory structure 104 to be substituted for future failed cells/blocks/columns. Controller 102 can have various functionality in addition to the specific functionality described herein. For example, when host 106 needs to read data from or write data to memory structure 104, host 106 will communicate with controller 102. If host 106 provides a logical address to which data is to be read/written, controller 102 converts the logical address received from the host to a physical address in physical memory structure 104.

Memory cells of memory structure 104 may be configured as an array. Accordingly, memory structure 104 may hereinafter be referred to as memory array 104. By way of non-limiting example, flash memory devices in a NAND configuration (NAND flash memory) typically contain memory cells connected in series. A NAND string is an example of a set of series-connected memory cells and select gate transistors that can be used within memory array 104. A NAND memory array may be configured so that the array is composed of multiple NAND strings of which a NAND string is composed of multiple memory cells sharing a single bit line and accessed as a group. Alternatively, memory array 104 may be configured as a NOR memory array. NAND and NOR memory configurations are exemplary, and the memory cells of memory array 104 may be otherwise configured, for example, resistive random access memory (ReRAM) cross-point memory cells, magnetoresistive random access memory (MRAM) cells, and phase change random access memory (PCRAM) cells.

In some embodiments, controller 102 includes a front end module 125 that interfaces with the host 106, and a back end module 135 that interfaces with the one or more memory arrays 104 and various other modules/components of the memory device 100 (e.g., non-volatile memory sections 110 and 120, a register circuit 144, a decoder 146, etc.), which shall be described as follows.

Non-volatile memory sections 110 and 120 may each include a number of read only memory (ROM) cells. In some embodiments, each of the ROM cells may include a one-time-programmable memory cell (e.g., an electronic fuses (eFuse)), an erasable programmable read only memory (EPROM) cell, an electrically erasable programmable read only memory (ROM) cell. In the embodiment where the cells of the non-volatile memory sections 110 and 120 are eFuses, the non-volatile memory sections 110 and 120 may be each referred to as a fuseROM, or a fuse memory section. In one embodiment, data in memory cells of a fuse memory section, such as memory section 110,120, is not accessible by a user of the memory device. Instead, the data in memory cells of a fuse memory section is for use by the memory device to facilitate management and operation of the memory device. Implementing the cells of the non-volatile memory sections 110 and 120 as eFuses may advantageously prevent the information (e.g., operational information of memory array 104) stored in non-volatile memory sections 110 and 120 from being tampered with.

Figure 1A:
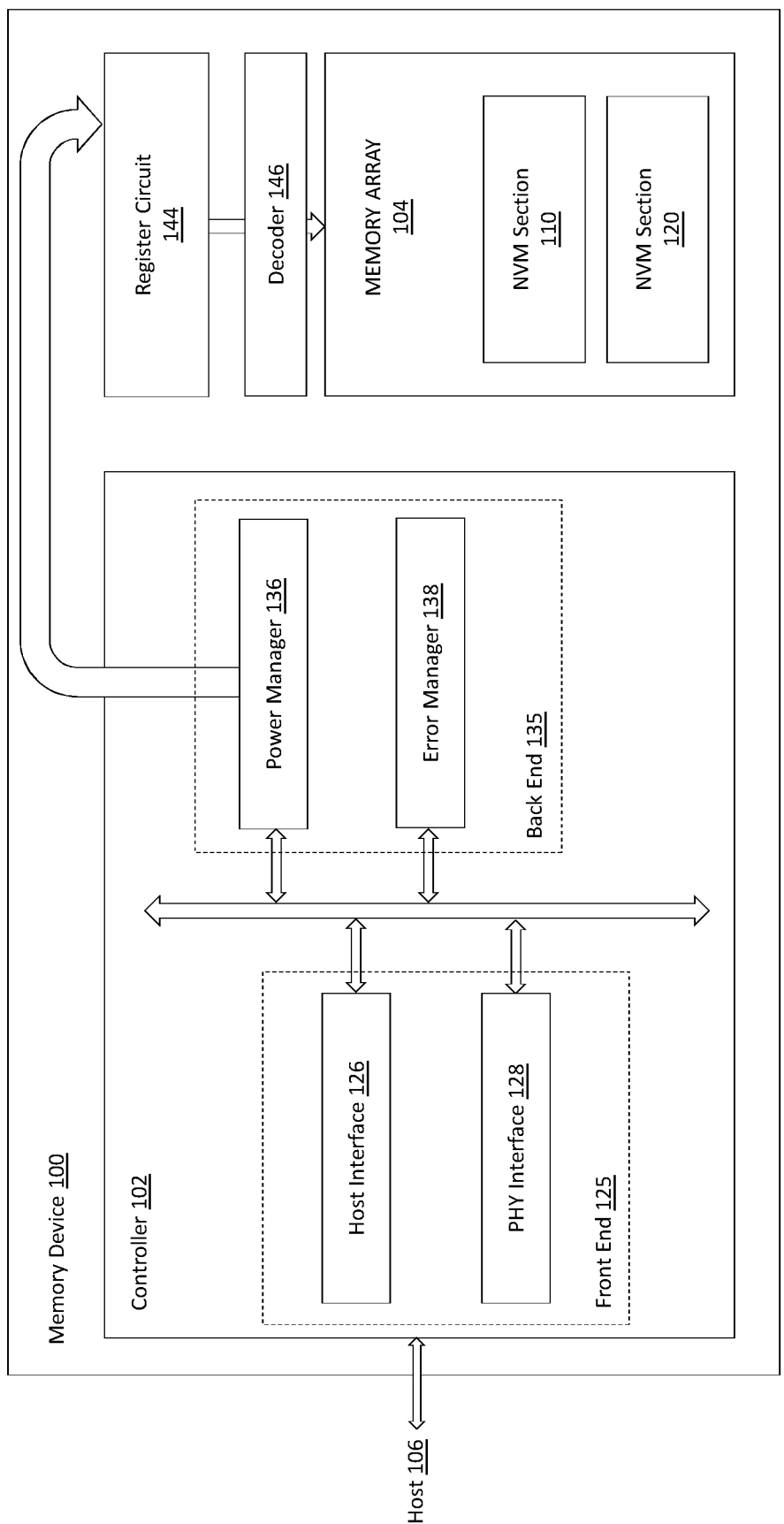
FIG. 1A is a block diagram of the memory device of FIG. 1 with a number of non-volatile memory sections contained in a memory array according to an example embodiment.

Although non-volatile memory sections 110 and 120 are illustrated as separate components from memory array 104 in the illustrated embodiment of FIG. 1 (e.g., disposed on different dies), non-volatile memory sections 110 and 120 may be integrated into memory array 104 (e.g., disposed within memory array 104) while remaining within the scope of the present disclosure. For example, FIG. 1A illustrates an embodiment where non-volatile memory sections 110 and 120 are each formed as a respective portion of regular memory cells of memory array 104 except that non-volatile memory sections 110 and 120 are only used to store operational information of memory array 104 and cannot be accessed to write or read user data. Controller 102 may differentiate such non-volatile memory sections 110 and 120 from other regular cells of memory array 104 by an address, identifier, or specific signal associated with each of non-volatile memory sections 110 and 120.

In some embodiments, non-volatile memory sections 110 and 120 are configured to permanently store one or more copies of operational information of memory array 104. Such operational information indicates one or more previously identified bad columns of memory array 104 (and corresponding replacements), one or more previously identified bad blocks of memory array 104 (and corresponding replacements), and/or one or more operating parameters (e.g., trimmed voltages) of memory array 104. For example, one or more eFuses of the non-volatile memory sections 110 and/or 120 are burned to indicate the location of a bad column or block.

As such, when a wake-up operation is performed on memory array 104 (e.g., transitioning memory array 104 out of a low-power state, the operational information is read or load into register circuit 144 so that the respective locations of bad column(s)/block(s) and corresponding replacements, and various operating parameters are indicated by the contents of the registers of register circuit 144. When host 106 sends a memory access command to memory array 104 through controller 102, the physical address to be accessed is compared with the addresses in register circuit 144. If a bad column/block is indicated, instead of trying to access the bad column/block, the replacement of the bad column/block is accessed. For example, register circuit 144 can provide a replacement address to decoder 146 such that the bad column/block is not accessed.

In some other embodiments, the wake-up operation may be performed on memory array 104 to cause memory array 104 to transition out of a power-off state (e.g., turn on memory array 104). Prior to or simultaneously with memory array 104 being turned on, the operational information is read or load into register circuit 144 so that the respective locations of bad column(s)/block(s) and corresponding replacements, and various operating parameters are indicated by the contents of the registers of register circuit 144. As such, memory array 104 can be properly accessed as discussed above.

Referring still to FIG. 1, and in further detail, the depicted components of controller 102 may take the form of a packaged functional hardware unit (e.g., an electrical circuit) designed for use with other components, program code (e.g., software or firmware) executable by a (micro) processor or processing circuitry that usually performs a particular function of related functions, or a self-contained hardware or software component that interfaces with a larger system. For example, each module may include an application specific integrated circuit (ASIC), a Field Programmable Gate Array (FPGA), an electrical circuit, a digital logic circuit, an analog circuit, a combination of discrete circuits, gates, or any other type of hardware or combination thereof. Alternatively or additionally, each module may include software stored in a processor readable device (e.g., memory) to program a processor to perform the functions described herein.

Front end module 125 includes a host interface 126 and a physical layer interface (PHY) 128 that provide the electrical interface with the host 106 or a next level storage controller. The choice of the type of host interface 126 can depend on the type of memory being used. Examples of host interface 126 include, but are not limited to, SATA, SATA Express, SAS, Fibre Channel, USB, PCIe, MMC and NVMe. Host interface 126 typically facilitates transfer for data, control signals, and timing signals. In one embodiment, front end module 125 provides a single communication interface adapted to communicate with an external computing device for controller 102 and memory array 104 of memory device 100.

Back end module 135 includes a power manager 136 and an error manager 138. In some embodiments, in connection with a first wake-up operation (e.g., transitioning memory array 104 out of a low-power state or a power-off state), power manager 136 can select one of the non-volatile memory sections 110 and 120 (e.g., 110) as a starting section to retrieve one or more copies of the operational information of memory array 104 stored therein; and in connection with a second (successive) wake-up operation (e.g., transitioning memory array 104 out of a low-power state or a power-off state), power manager 136 can select the one or the other of the non-volatile memory sections 110 and 120 (e.g., 110 or 120) as the starting section to retrieve the one or more copies of the operational information of memory array 104 stored therein. The term starting section as used herein may be referred to as an initial memory section between non-volatile memory sections 110 and 120 or among other non-volatile memory sections that power manager 136 first selects in connection with each of a number of successive wake-up operations. As such, power manager 136 may not always use a same non-volatile memory section as the starting section for the successive wake-up operations.

Further, when power manager 136 selects a non-volatile memory section in connection with the second wake-up operation, power manager 136 may not consider whether success of a prior attempt to retrieve the one or more copies of operational information from either non-volatile memory section 110 or 120 exists, and/or whether failure of a prior attempt to retrieve the one or more copies of operational information from either non-volatile memory section 110 or 120 exists.

For example, power manager 136 may deterministically select non-volatile memory section 120 in response to receiving a plane address that designates non-volatile memory section 120 even though success of a prior attempt to retrieve the one or more copies of operational information from non-volatile memory section 120 lacks, or failure of a prior attempt to retrieve the one or more copies of operational information from non-volatile memory section 120 exists. In some embodiments, power manager 136 may receive such a plane address in a command, instruction, signal, trigger, set of commands, instructions, or signals, mode transition from host 106 prior to, simultaneously with, or subsequently to power manager 136 receiving a command to wake up memory array 104. As such, power manager 136 can deterministically switch between selection of the non-volatile memory sections 110 and 120 as the starting section for each successive wake-up operation.

In another example, power manager 136 may randomly select one of the non-volatile memory sections 110 and 120 in connection with each of the wake-up operation. In some embodiments, power manager 136 may use a random number function or module to generate a number, which corresponds to an identification of either non-volatile memory section 110 or 120, in connection with each wake-up operation. As such, based on the number, power manager 136 can randomly select one of the non-volatile memory section 110 or 120 to retrieve the one or more copies of operational information.

In response to power manager 136 retrieving a copy of the operational information of the memory array 104 from a selected one of the non-volatile memory sections 110 and 120, error manager 138 can decode the copy of operational information to obtain encoded data, e.g., error correction codes (ECCs). Based on the ECCs, error manager 138 can determine whether the retrieval of the operational information succeeds. For example, error manager 138 may compare the decoded operational information with one or more corresponding ECCs to determine whether the decoded operational information contain a tolerable (correctable) amount of errors. If so (the retrieval of the operational information succeeds), error manager 138 may communicate with power manager 136 to allow power manager 136 to proceed with the wake-up operation such as, for example, loading the operational information into register circuit 144 to get memory array 104 ready for further operations (e.g., read or write operation). On the other hand, if not (the retrieval of the operational information fails), error manger 138 may communicate with power manager 136 to cause power manager 136 to iteratively retrieve another copy of the operational information of the memory array 104 from the selected one of the non-volatile memory sections 110 and 120 until error manager 138 determines that the retrieval succeeds. Various other error detection techniques can be used by error manager 138 such as, for example, cyclic redundancy checks (CRCs), parity checks, etc., while remaining within the scope of present disclosure.

Figure 2:
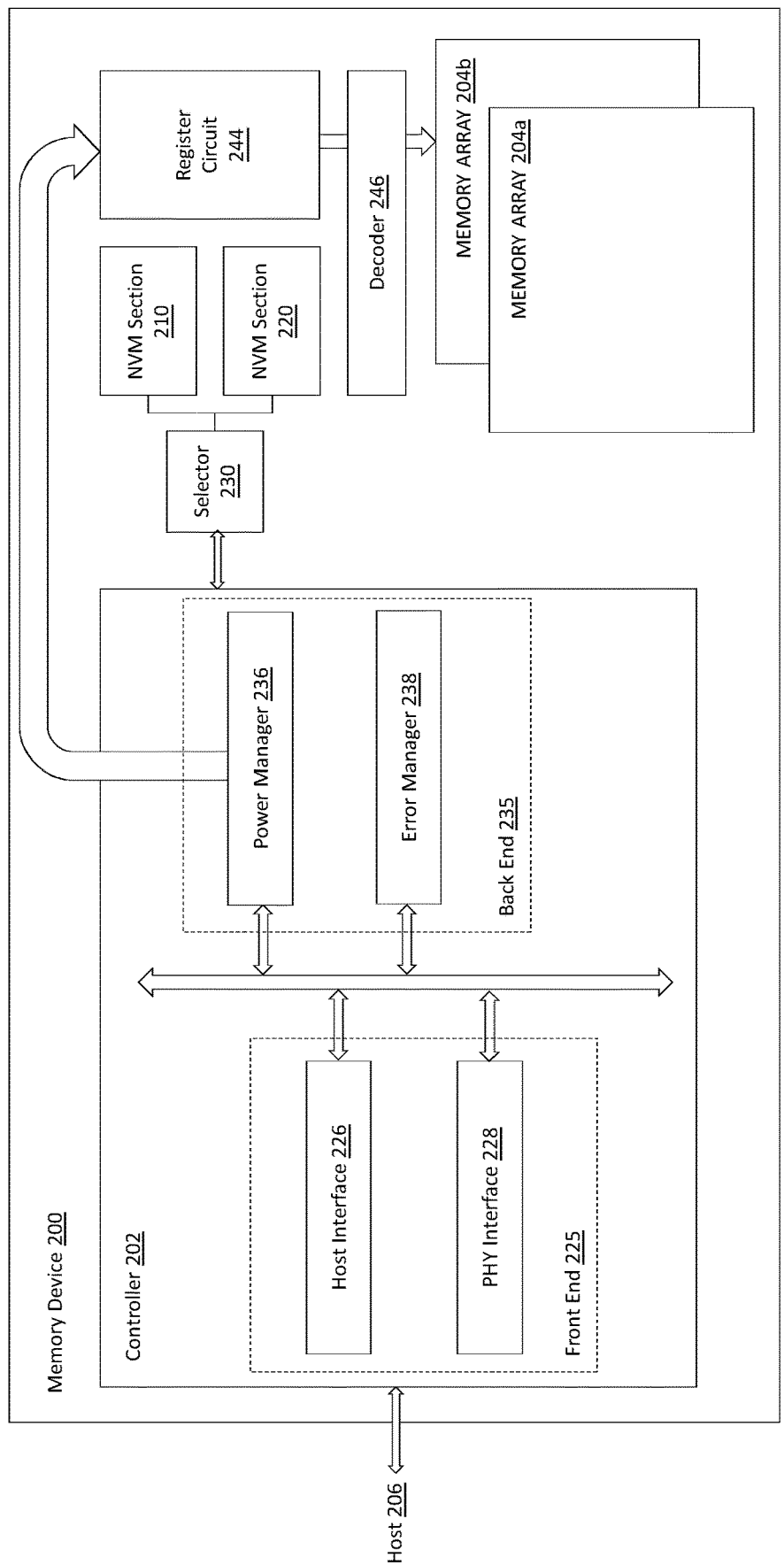
FIG. 2 is a block diagram of another memory device including a controller and a selector according to an example embodiment.

FIG. 2 illustrates a block diagram of an embodiment of a memory device 200, in accordance with some embodiments. Memory device 200 is substantially similar to memory device 100 except that memory device 200 further includes a selector 230 and two or more memory arrays 204a and 204b. Thus, controller 202 and its components host interface 226, PHY interface 228, power manager 236, error manager 238, memory array 204, host 206, non-volatile memory sections 210 and 220, register circuit 244, and decoder 246 of memory device 200 that are substantially similar to controller 102 and its components host interface 126, PHY interface 128, power manager 136, error manager 138, memory array 104, host 106, non-volatile memory sections 110 and 120, register circuit 144, and decoder 146 of memory device 100, respectively, are not discussed again in FIG. 2. Still similarly, host interface 226 and PHY interface 228 may form a front end 225, and power manager 236 and error manager 238 may form a back end 235.

In some embodiments, selector 230 is communicatively coupled between the non-volatile memory sections 210 and 220, and controller 202. Selector 230 may be any component configured to select a specific non-volatile memory section between 210 and 220 in connection with a wake-up operation. For example, selector 230 may be implemented as a switch, a multiplexer, a gate, a flip flop, or the like. In some embodiments, selector 230 is configured to toggle between the non-volatile memory sections 210 and 220 in successive wake-up operations to select one of the non-volatile memory sections 210 and 220. Upon selector 230 making the selection between the non-volatile memory sections 210 and 220, power manager 236 can retrieve one or more copies of operational information from the selected non-volatile memory section, as discussed above with respect to power manager 136 of FIG. 1.

Selector 230 may select one of the non-volatile memory sections 210 and 220 in response to receiving a plane address that designates the selected non-volatile memory section. In some embodiments, the plane address may be associated with a particular one of the two or more memory arrays 204a and 204b. For example, selector 230 may receive a first plane address that designates non-volatile memory section 210 which stores operational information for memory array 204a, and receive a second, different plane address designating non-volatile memory section 220 which stores operational information for memory array 204b. Selector 230 may receive such a plane address in a command from host 206 prior to, simultaneously with, or subsequently to power manager 236 or selector 230 receiving a command to wake up memory array 204. As such, selector 230 can deterministically switch between selection of the non-volatile memory sections 210 and 220 for each successive wake-up operation.

Further, selector 230 can select one of the non-volatile memory sections 210 and 220 in connection with operating memory array 204 in a first one of the successive wake-up operations, and switch to the other of the non-volatile memory sections 210 and 220 in connection with operating memory array 204 in a second (e.g., subsequent) one of the successive wake-up operations. In other words, selector 230 may perform a "ping pong" operation in selecting the non-volatile memory sections 210 and 220 for the successive wake-up operations. In such an embodiment, selector 230 may or may not rely on the above-described plane address to select a non-volatile memory section.

Figure 3:
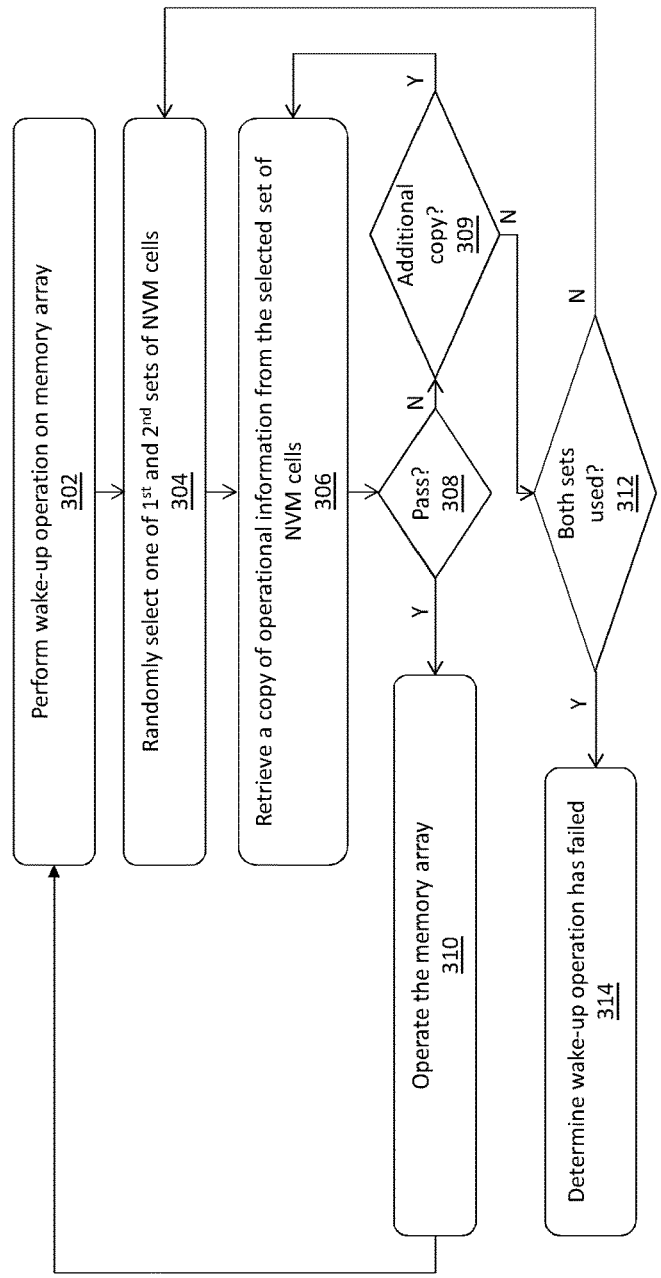
FIG. 3 illustrates a flow chart of a method of randomly selecting one non-volatile memory section from a number of non-volatile memory sections in response to waking up a memory array according to an example embodiment.

FIG. 3 illustrates a flow chart of an embodiment of a method 300 for randomly selecting one from a number of non-volatile memory sections in response to each of one or more successive wake-up operations, in accordance with various embodiments. The operations of the method 300 are performed by respective components illustrated in FIGS. 1-2. For purposes of discussion, the following embodiment of the method 300 is described in conjunction with FIGS. 1-2. The illustrated embodiment of the method 300 is merely an example. Therefore, it should be understood that any of a variety of operations may be omitted, re-sequenced, and/or added while remaining within the scope of the present disclosure.

The method 300 starts with operation 302 in which a wake-up operation is initiated to perform on a memory array (e.g., 104, 204). In some embodiments, a controller of a memory device that includes the memory array (e.g., controller 102, controller 202) may initiate a wake-up operation on the memory array in response to receiving a command from a host that requests the memory array to transition out of a low-power state or a power-off state. Such a wake-up operation may sometimes be referred to as a Power-On-Reset (POR) operation.

The method 300 continues to operation 304 in which one of a first set of non-volatile memory cells and a second set of non-volatile memory cells is randomly selected. For example, in response to the initiation of the first wake-up operation, controller 102 of memory device 100 may randomly select one of the non-volatile memory sections 110 and 120, each of which contains a number of non-volatile memory cells (e.g., eFuses). Similarly, in response to the initiation of the wake-up operation, selector 230 of memory device 200 may randomly select one of the non-volatile memory sections 210 and 220, each of which contains a number of non-volatile memory cells (e.g., eFuses).

The method 300 continues to operation 306 in which a copy of operational information of the memory array is retrieved from the selected set of non-volatile memory cells. For example, in response to controller 102 randomly selecting non-volatile memory section 110, controller 102 can retrieve a first copy of the operational information of the memory array 104 from non-volatile memory section 110. Similarly, in response to selector 230 randomly selecting non-volatile memory section 210, controller 202 can retrieve a first copy of the operational information of the memory array 204 from non-volatile memory section 210.

Upon retrieving the copy of operational information from the selected set of non-volatile memory cells, the controller may use one or more error detection techniques to determine whether the retrieved operational information passes a predefined criterion (operation 308). Using the above example in which controller 102 retrieves the first copy of the operational information from non-volatile memory section 110, controller 102 may decode the first copy of operational information, which may include one or more corresponding error detection codes (e.g., ECCs, parities, etc.). Based on the error detection codes, controller 102 determines whether the amount of errors contained in the first copy of operational information exceeds a tolerable threshold. If the amount of errors contained in the first copy of operational information exceeds the tolerable threshold, controller 102 may determine that the retrieval of the first copy of operational information does not pass the criteria, which may cause the method 300 to proceed to operation 309 to determine whether one or more additional copies of operational information are available in the selected set of non-volatile memory cells. If the amount of errors contained in the first copy of operational information does not exceed the tolerable threshold, controller 102 may determine that the retrieval of the first copy of operational information passes the criteria, which may cause the method 300 to proceed to operation 310.

In operation 310, controller 102 can load the retrieved operational information into register circuit 144. Upon receiving further command from host 106, controller 102 can use the contents loaded into register circuit to operate memory array 104.

In operation 309, in response to controller 102 determining that at least one additional copy of operational information of memory array 104 is available (e.g., has not been used), for example, in the selected non-volatile memory section 110 ("yes" branch from operation 309), the method 300 proceeds again to operation 306 in which controller 102 retrieves a second copy of operational information of memory array 104 from the selected non-volatile memory section 110, and to operation 308 in which controller 102 uses corresponding error detection codes to determine whether the amount of errors contained in the second copy of operational information exceeds the tolerable threshold. In some embodiments, controller 102 may iteratively perform the similar operation until the amount of errors contained in a copy of the operational information does not exceed the tolerable threshold. Similarly, if the controller 102 had retrieved operational information from non-volatile memory section 210, the controller 102 may determine 309 whether at least one additional copy of operational information of memory array 104 is available (e.g., has not been used) and proceed in similar manner to the instance in which the selected set of non-volatile memory cells are from non-volatile memory section 110.

In response to controller 102 retrieving all the available copies of operational information stored in non-volatile memory section 110 (or non-volatile memory section 210, depending on which was selected) and determining that none of the retrieved copies stored in non-volatile memory section 110 (or non-volatile memory section 210, depending on which was selected) passes the criteria ("no" branch from operation 309), the method 300 proceeds to operation 312 to determine whether both of the first set of non-volatile memory cells and the second set of non-volatile memory cells have been tried to perform the wake-up operation. If so, the method 300 proceeds to operation 314 to determine that the wake-up operation has failed.

Continuing with the above example, in operation 312, if controller 102 determines that both of the non-volatile memory sections 110 and 120 have been tried to perform the wake-up operation (operations 306-308) and none of the retrieved copies stored in either the non-volatile memory section 110 or non-volatile memory section 120 passes the criteria, controller 102 may determine that the wake-up operation has failed (operation 314). However, if controller 102 determines that not both of the non-volatile memory sections 110 and 120 have been tried to perform the first wake-up operation, controller 102 may randomly select one of the non-volatile memory sections 110 and 120 again (operation 304).

Subsequently to operation 310, a successive wake-up operation may be initiated to perform on the memory array (e.g., the method 300 proceeding again to operation 302). For example, subsequent to operation 310, memory array 104 may perform one or more read or write operations as requested by host 106. In some cases, where host 106 does not request memory array 104 to perform certain active operations (read or write operations) for a certain period of time, memory array 104 may spontaneously or responsively (to host 106) transition to a low-power state or power-off state. As such, when host 106 requests memory array 104 to perform another active function, a second wake-up operation may be initiated to perform on memory array 104.

Figure 4:
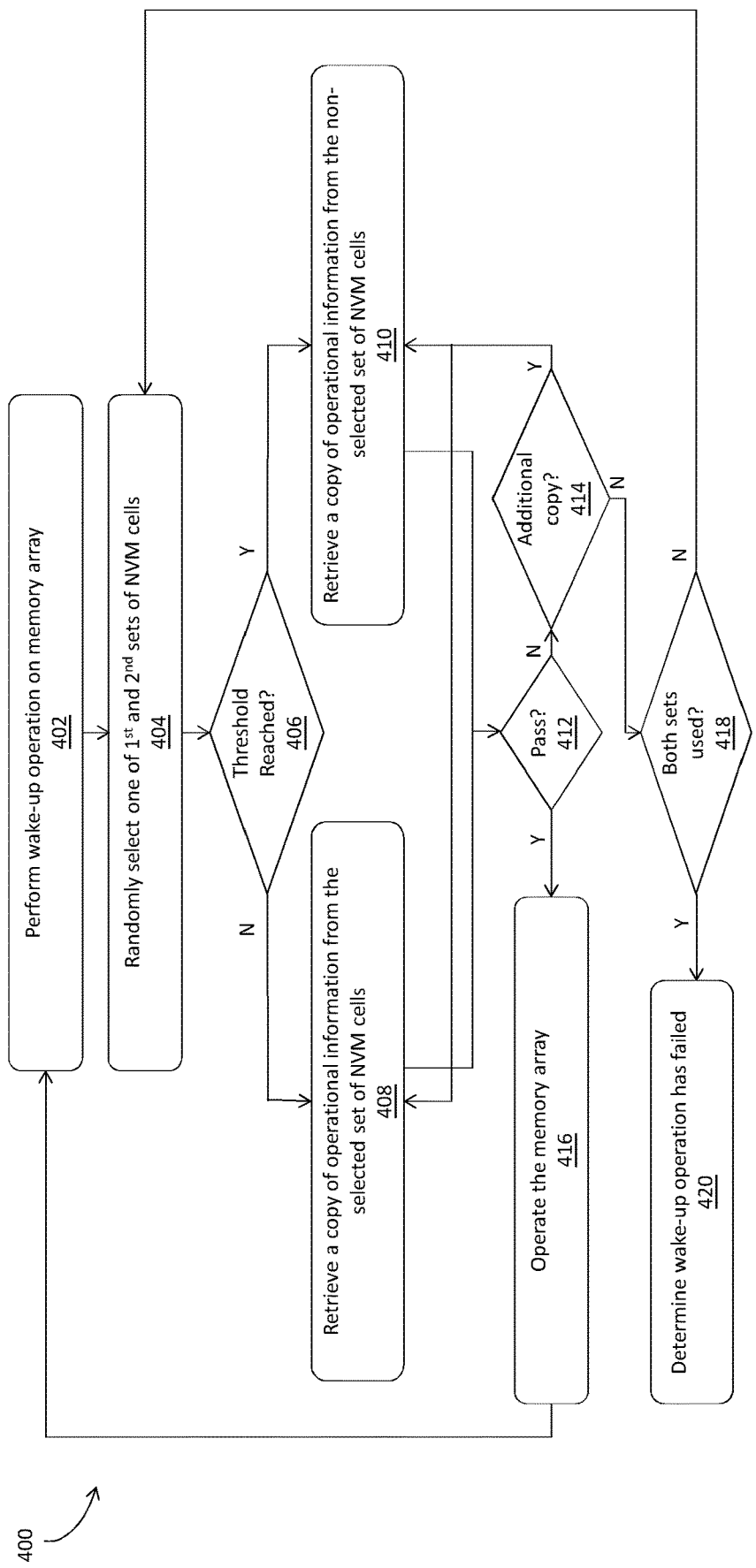
FIG. 4 illustrates a flow chart of another method of randomly selecting one non-volatile memory section from a number of non-volatile memory sections in response to waking up a memory array according to an example embodiment.

FIG. 4 illustrates a flow chart of an embodiment of another method 400 for randomly selecting one from a number of non-volatile memory sections in response to each of one or more successive wake-up operations, in accordance with various embodiments. The operations of the method 400 are performed by respective components illustrated in FIGS. 1-2. For purposes of discussion, the following embodiment of the method 400 is described in conjunction with FIGS. 1-2. The illustrated embodiment of the method 400 is merely an example. Therefore, it should be understood that any of a variety of operations may be omitted, re-sequenced, and/or added while remaining within the scope of the present disclosure.

The method 400 starts with operation 402 in which a wake-up operation is initiated to perform on a memory array (e.g., 104, 204). In some embodiments, a controller of a memory device that includes the memory array (e.g., controller 102, controller 202) may initiate a wake-up operation on the memory array in response to receiving a command from a host that requests the memory array to transition out of a low-power state or a power-off state. Such a wake-up operation may sometimes be referred to as a Power-On-Reset (POR) operation.

The method 400 continues to operation 404 in which one of a first set of non-volatile memory cells and a second set of non-volatile memory cells is randomly selected. For example, in response to the initiation of the wake-up operation, controller 102 of memory device 100 may randomly select one of the non-volatile memory sections 110 and 120, each of which contains a number of non-volatile memory cells (e.g., eFuses). Similarly, in response to the initiation of the wake-up operation, selector 230 of memory device 200 may randomly select one of the non-volatile memory sections 210 and 220, each of which contains a number of non-volatile memory cells (e.g., eFuses).

Next, the method 400 continues to operation 406 to determine whether a number of failed wake-up operations using the one or more copies of operational information stored in the selected set of non-volatile memory cells exceeds a pre-defined threshold. If not, the method 400 proceeds to operation 408 in which a copy of operational information stored is retrieved from the selected set of non-volatile memory cells; and if so, the method 400 proceeds to operation 410 in which a copy of operational information stored is retrieved from the non-selected set of non-volatile memory cells.

Continuing with the above example where controller randomly selects non-volatile memory section 120 at operation 404, controller 102 may count the number of previous failed wake-up operations using the one or more copies of operational information stored in non-volatile memory section 120. In some embodiments, controller 102 may include a counter circuit to dynamically count, record, or otherwise manage the success or failure of each of the previously performed wake-up operations. Further, controller 102 may count, record, or otherwise manage which of the non-volatile memory sections is retrieved to render the success or failure of each of the previously performed wake-up operations. Controller 102 can then compare the counted number with a pre-defined threshold. In response to determining that the number of failed wake-up operations using the one or more copies of the operational information stored in non-volatile memory section 120 exceeds the threshold, controller 102 may select the other non-volatile memory section, 110 in the current example, to retrieve the one or more copies of operational information stored therein. However, in response to determining that the number of failed wake-up operations using the one or more copies of the operational information stored in non-volatile memory section 120 does not exceed the threshold, controller 102 may remain the selection of non-volatile memory section 120 to retrieve the one or more copies of operational information stored therein.

Upon retrieving the copy of operational information from the selected set of non-volatile memory cells, the controller may use one or more error detection techniques to determine whether the retrieved operational information passes a pre-defined criterion (operation 412).

In the above example, when controller 102 retrieves a first copy of operational information of memory array 104 from non-volatile memory section 120 (operation 408) and determines that the amount of errors contained in the first copy of the operational information exceeds a tolerable threshold (operation 412), controller 102 may retrieve a second copy of operational information of memory array 104, if available, from the selected non-volatile memory section 120 ("yes" branch from operation 414 to operation 408), and use corresponding error detection codes to determine whether the amount of errors contained in the second copy of operational information exceeds the tolerable threshold. In some embodiments, controller 102 may iteratively perform the similar operation until the amount of errors contained in a copy of the operational information does not exceed the tolerable threshold.

Similarly, when controller 102 retrieves a first copy of operational information of memory array 104 from non-volatile memory section 110 (operation 410) and determines that the amount of errors contained in the first copy of the operational information exceeds a tolerable threshold (operation 412), controller 102 may retrieve a second copy of operational information of memory array 104, if available, from the non-volatile memory section 110 ("yes" branch from operation 414 to operation 410), and use corresponding error detection codes to determine whether the amount of errors contained in the second copy of operational information exceeds the tolerable threshold. In some embodiments, controller 102 may iteratively perform the similar operation until the amount of errors contained in a copy of the operational information does not exceed the tolerable threshold.

In response to controller 102 retrieving all the available copies of operational information stored in non-volatile memory section 110 or 120 and determining that none of the retrieved copies stored in non-volatile memory section 110 or 120 passes the criteria ("no" branch from operation 414), the method 400 proceeds to operation 418 to determine whether both sets of non-volatile memory cells have been used. If so, the method 400 proceeds to operation 420; and if not, the method proceeds back to operation 404.

In response to determining that the amount of errors contained in at least one copy of the operational information stored in non-volatile memory section 110 or 120 does not exceed the tolerable threshold ("yes" branch from operation 412), the method 400 proceeds to operation 416 to operate the memory array. In response to determining that both sets of non-volatile memory cells have been used and none of the retrieved copies stored in either the non-volatile memory section 110 or non-volatile memory section 120 passes the criteria ("yes" branch from operation 418), the method 400 proceeds to operation 420 in which it is determined that the first wake-up operation has failed.

In some embodiments, subsequent to operation 416, the method 400 may proceed again to operation 402 in which one or more additional or successive wake-up operations may be performed on the memory array. As such, at least one or more of the operations of the method 400 may be iteratively performed.

For example, subsequent to operation 416, memory array 104 may perform one or more read or write operations as requested by host 106. In some cases, where host 106 does not request memory array 104 to perform certain active operations (read or write operations) for a certain period of time, memory array 104 may spontaneously or responsively (to host 106) transition to a low-power state or power-off state. As such, when host 106 requests memory array 104 to perform another active function, a successive wake-up operation may be initiated to perform on memory array 104. Host 106 may send a command to controller 102 to perform a successive wake-up operation on memory array 104 or controller 102 may automatically perform a second wake-up operation on memory array 104.

Figure 5:
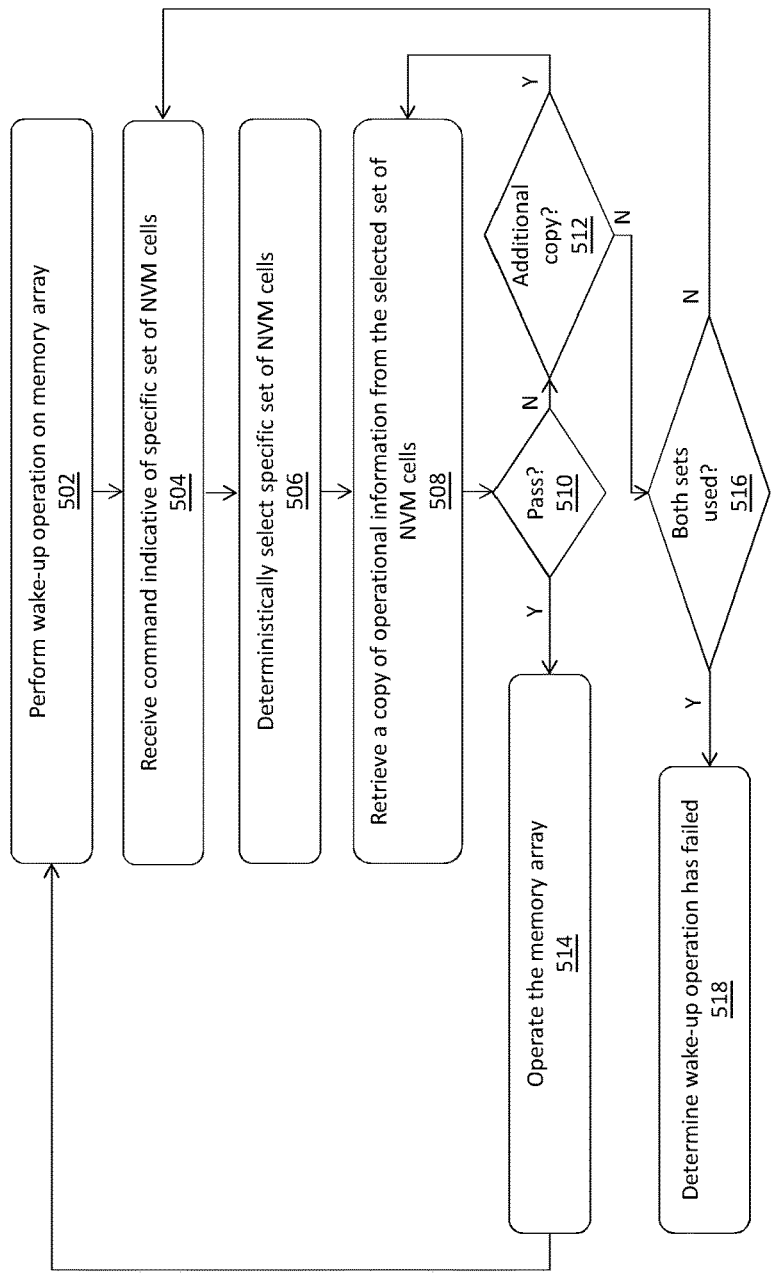
FIG. 5 illustrates a flow chart of a method of deterministically selecting one non-volatile memory section from a number of non-volatile memory sections in response to waking up a memory array according to an example embodiment.

FIG. 5 illustrates a flow chart of an embodiment of a method 500 for deterministically selecting one from a number of non-volatile memory sections in response to each of one or more successive wake-up operations, in accordance with various embodiments. The operations of the method 500 are performed by respective components illustrated in FIGS. 1-2. For purposes of discussion, the following embodiment of the method 500 is described in conjunction with FIGS. 1-2. The illustrated embodiment of the method 500 is merely an example. Therefore, it should be understood that any of a variety of operations may be omitted, re-sequenced, and/or added while remaining within the scope of the present disclosure.

The method 500 starts with operation 502 in which a wake-up operation is initiated to perform on a memory array (e.g., 104, 204). In some embodiments, a controller of a memory device that includes the memory array (e.g., controller 102, controller 202) may initiate a wake-up operation on the memory array in response to receiving a command from a host that requests the memory array to transition out of a low-power state or a power-off state. Such a wake-up operation may sometimes be referred to as a Power-On-Reset (POR) operation.

The method 500 continues to operation 504 in which a command indicative of a specific set (e.g., a first set, a second set, etc.) of non-volatile memory cells is received. In some embodiments, the command may include any indication that clearly identifies the specific set of non-volatile memory cells. For example, such indications which may comprise an address, an associated signal, a flag, and/or other identification of the first set of non-volatile memory cells, to designate the first set of non-volatile memory cells. For example, in response to the initiation of the first wake-up operation, controller 102 of memory device 100 may concurrently receive a command that includes an indication of the non-volatile memory section 110. Similarly, in response to the initiation of the first wake-up operation, selector 230 of memory device 200 may concurrently receive a command that includes an indication of the non-volatile memory section 210.

The method 500 continues to operation 506 in which the specific set of non-volatile memory cells is deterministically selected. For example, in response to receiving the command that includes an indication of the non-volatile memory section 110, controller 102 of memory device 100 may deterministically select the non-volatile memory section 110 according to the command. Similarly, in response to receiving the command that includes an indication of the non-volatile memory section 210, controller 202 of memory device 200 may deterministically select the non-volatile memory section 210 according to the command.

The method 500 continues to operation 508 in which a copy of operational information of the memory array is retrieved from the selected set of non-volatile memory cells. For example, in response to controller 102 deterministically selecting non-volatile memory section 110, controller 102 can retrieve a first copy of the operational information of the memory array 104 from non-volatile memory section 110. Similarly, in response to selector 230 deterministically selecting non-volatile memory section 210, controller 202 can retrieve a first copy of the operational information of the memory array 204 from non-volatile memory section 210. In some embodiments, the operational information may include various information regarding how memory array 104 or 204 is configured. For example, the information may include how columns/blocks of the memory 104 or 204 are physically configured, where previously identified bad columns/blocks of the memory array 104 or 204 are located, where corresponding replacement columns/blocks for the bad columns/blocks are located, etc.

Upon retrieving the copy of operational information from the selected set of non-volatile memory cells, the controller may use one or more error detection techniques to determine whether the retrieved operational information passes a predefined criterion (operation 510). Using the above example in which controller 102 retrieves the first copy of the operational information from non-volatile memory section 110, controller 102 may decode the first copy of operational information, which may include one or more corresponding error detection codes (e.g., ECCs, parities, etc.). Based on the error detection codes, controller 102 can determine whether the amount of errors contained in the first copy of operational information exceeds a tolerable threshold. If the amount of errors contained in the first copy of operational information exceeds the tolerable threshold, controller 102 may determine that the retrieval of the first copy of operational information does not pass the criteria, which may cause the method 500 to proceed to operation 512 to determine whether one or more additional copies of operational information are available in the selected set of non-volatile memory cells. If the amount of errors contained in the first copy of operational information does not exceed the tolerable threshold, controller 102 may determine that the retrieval of the first copy of operational information passes the criteria, which may cause the method 500 to proceed to operation 514.

In operation 514, controller 102 can load the retrieved operational information into register circuit 144. Upon receiving further command from host 106, controller 102 can use the contents loaded into register circuit to operate memory array 104.

In operation 512, in response to controller 102 determining that at least one additional copy of operational information of memory array 104 is available (e.g., has not been used) in the selected non-volatile memory section 110 ("yes" branch from operation 512), the method 500 proceeds again to operation 508 in which controller 102 retrieves a second copy of operational information of memory array 104 from the selected non-volatile memory section 110, and to operation 510 in which controller 102 uses corresponding error detection codes to determine whether the amount of errors contained in the second copy of operational information exceeds the tolerable threshold. In some embodiments, controller 102 may iteratively perform the similar operation until the amount of errors contained in a copy of the operational information does not exceed the tolerable threshold. Similarly, if the controller 102 had retrieved operational information from non-volatile memory section 210, the controller 102 may determine 411 whether at least one additional copy of operational information of memory array 104 is available (e.g., has not been used) and proceed in similar manner to the instance in which the selected set of non-volatile memory cells are from non-volatile memory section 110.

In response to controller 102 retrieving all the available copies of operational information stored in non-volatile memory section 110 (or non-volatile memory section 210, depending on which was selected) and determining that none of the retrieved copies stored in non-volatile memory section 110 (or non-volatile memory section 210, depending on which was selected) passes the criteria ("no" branch from operation 512), the method 500 proceeds to operation 516 to determine whether both of the first set of non-volatile memory cells and the second set of non-volatile memory cells have been tried to perform the first wake-up operation. If so, the method 500 proceeds to operation 518 in which the wake-up operation is determined as failed; and if not, the method 500 proceeds back to operation 504 to receive another command indicative of one of the first and second sets of non-volatile memory cells.

Continuing with the above example, in operation 516, if controller 102 determines that both of the non-volatile memory sections 110 and 120 have been tried to perform the wake-up operation (operations 508-510) and none of the retrieved copies stored in either the non-volatile memory section 110 or non-volatile memory section 120 passes the criteria, controller 102 may determine that the wake-up operation has failed (operation 518).

Subsequently to operation 514, a successive wake-up operation may be initiated to perform on the memory array (e.g., operation 502). For example, subsequent to operation 514, memory array 104 may perform one or more read or write operations as requested by host 106. In such operations, a different set of non-volatile memory cells may be selected that was selected in the previous iteration of operations 502-514. In some cases, where host 106 does not request memory array 104 to perform certain active operations (read or write operations) for a certain period of time, memory array 104 may spontaneously or responsively (to host 106) transition to a low-power state or power-off state. As such, when host 106 requests memory array 104 to perform another active function, a successive wake-up operation may be initiated to perform on memory array 104. Host 106 may send a command to controller 102 to perform a successive wake-up operation on memory array 104 or controller 102 may automatically perform a successive wake-up operation on memory array 104.

Figure 6A:
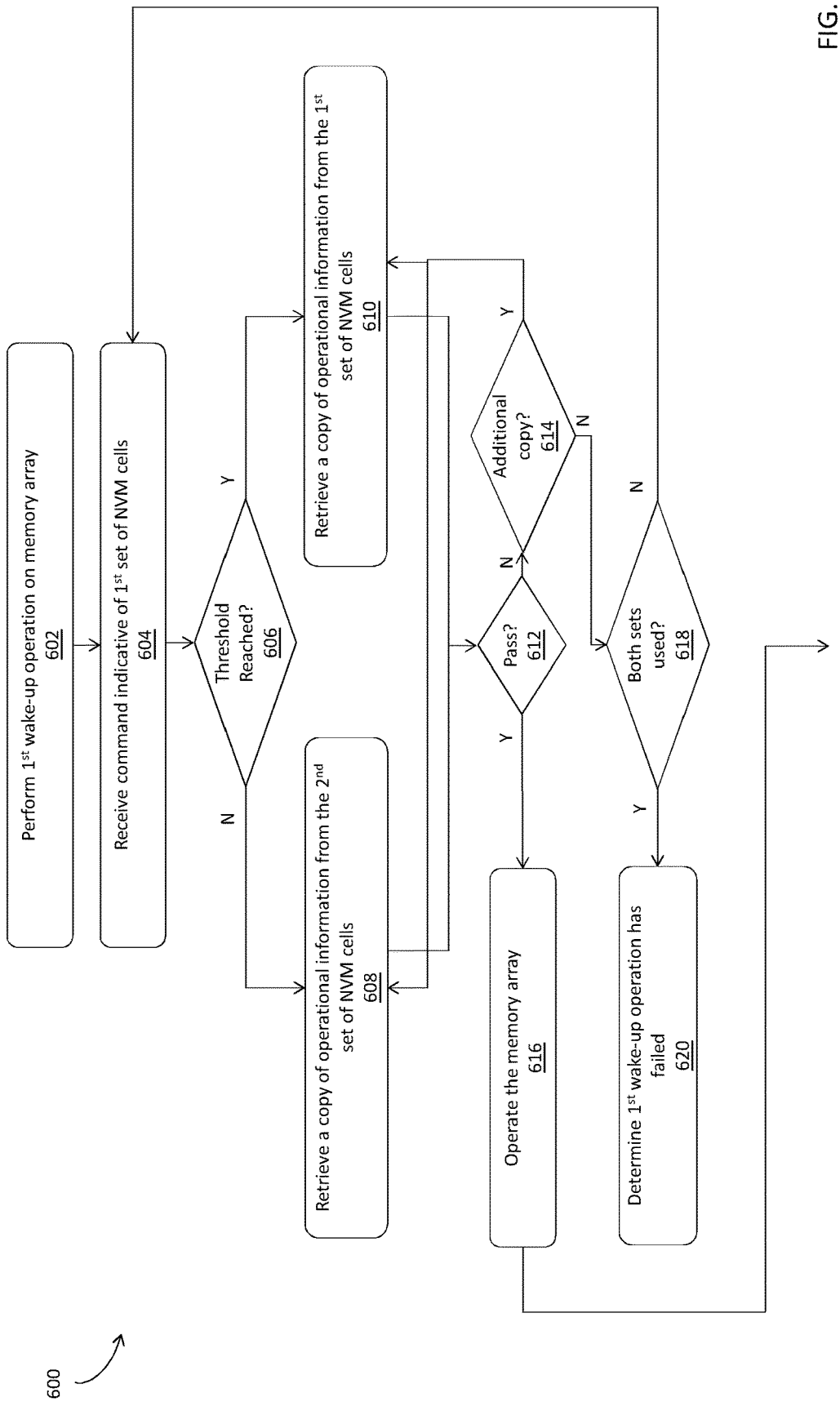
FIGS. 6A and 6B illustrate a flow chart of another method of deterministically selecting one non-volatile memory section from a number of non-volatile memory sections in response to waking up a memory array according to an example embodiment.
Figure 6B:
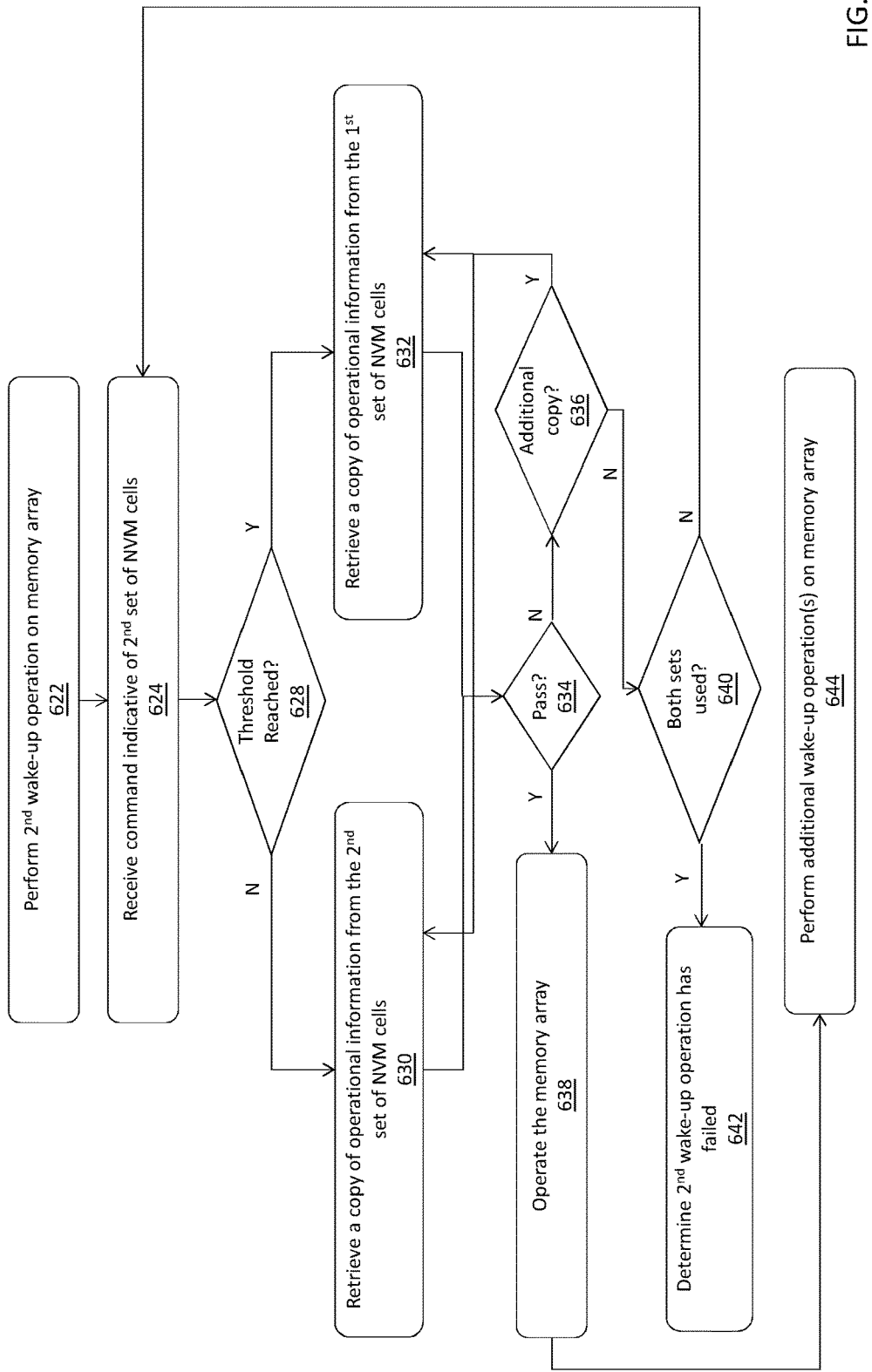

FIGS. 6A and 6B collectively illustrate a flow chart of an embodiment of another method 600 for deterministically selecting one from a number of non-volatile memory sections in response to each of one or more successive wake-up operations, in accordance with various embodiments. The operations of the method 600 are performed by respective components illustrated in FIGS. 1-2. For purposes of discussion, the following embodiment of the method 600 is described in conjunction with FIGS. 1-2. The illustrated embodiment of the method 600 is merely an example. Therefore, it should be understood that any of a variety of operations may be omitted, re-sequenced, and/or added while remaining within the scope of the present disclosure.

The method 600 starts with operation 602 in which a first wake-up operation is initiated to perform on a memory array (e.g., 104, 204). In some embodiments, a controller of a memory device that includes the memory array (e.g., controller 102, controller 202) may initiate a wake-up operation on the memory array in response to receiving a command from a host that requests the memory array to transition out of a low-power state or a power-off state. Such a wake-up operation may sometimes be referred to as a Power-On-Reset (POR) operation.

The method 600 continues to operation 604 in which a command indicative of a first set of non-volatile memory cells is received. In some embodiments, the command may include any indication that clearly identifies the first set of non-volatile memory cells. For example, such indications which may comprise an address, an associated signal, a flag, and/or other identification of the first set of non-volatile memory cells, to designate the first set of non-volatile memory cells. For example, in response to the initiation of the first wake-up operation, controller 102 of memory device 100 may concurrently receive a command that includes an indication of the non-volatile memory section 110. Similarly, in response to the initiation of the first wake-up operation, selector 230 of memory device 200 may concurrently receive a command that includes an indication of the non-volatile memory section 210.

In response to receiving the command that includes an indication of the non-volatile memory section 110, controller 102 of memory device 100 may deterministically select the non-volatile memory section 110 according to the command. Similarly, in response to receiving the command that includes an indication of the non-volatile memory section 210, controller 202 of memory device 200 may deterministically select the non-volatile memory section 210 according to the command.

Next, the method 600 continues to operation 606 to determine whether a number of failed wake-up operations using the one or more copies of operational information stored in the selected set of non-volatile memory cells exceeds a pre-defined threshold. If not, the method 600 proceeds to operation 608 in which a copy of operational information stored is retrieved from the selected set of non-volatile memory cells; and if so, the method 600 proceeds to operation 610 in which a copy of operational information stored is retrieved from the non-selected set of non-volatile memory cells.

Continuing with the above example where controller deterministically selects non-volatile memory section 120 according to a command at operation 604, controller 102 may count the number of previous failed wake-up operations using the one or more copies of operational information stored in non-volatile memory section 120. In some embodiments, controller 102 may include a counter circuit to dynamically count, record, or otherwise manage the success or failure of each of the previously performed wake-up operations. Further, controller 102 may count, record, or otherwise manage which of the non-volatile memory sections is retrieved to render the success of failure of each of the previously performed wake-up operations. Controller 102 can then compare the counted number with a pre-defined threshold. In response to determining that the number of failed wake-up operations using the one or more copies of the operational information stored in non-volatile memory section 120 exceeds the threshold, controller 102 may select the other non-volatile memory section, 110 in the current example, to retrieve the one or more copies of operational information stored therein. However, in response to determining that the number of failed wake-up operations using the one or more copies of the operational information stored in non-volatile memory section 120 does not exceed the threshold, controller 102 may remain the selection of non-volatile memory section 120 to retrieve the one or more copies of operational information stored therein.

The method 600 proceeds to operation 612 in which the controller may use one or more error detection techniques to determine whether the retrieved operational information passes a predefined criterion. Next, the method 600 proceeds to operation 614 to check whether one or more additional copies of operational information are available in the selected or non-selected set of non-volatile memory cells.

In the above example, when controller 102 retrieves a first copy of operational information of memory array 104 from non-volatile memory section 120 (operation 608) and determines that the amount of errors contained in the first copy of the operational information exceeds a tolerable threshold (operation 612), controller 102 may retrieve a second copy of operational information of memory array 104, if available, from the selected non-volatile memory section 120 ("yes" branch from operation 614 to operation 608), and use corresponding error detection codes to determine whether the amount of errors contained in the second copy of operational information exceeds the tolerable threshold. In some embodiments, controller 102 may iteratively perform the similar operation until the amount of errors contained in a copy of the operational information does not exceed the tolerable threshold.

Similarly, when controller 102 retrieves a first copy of operational information of memory array 104 from non-volatile memory section 110 (operation 610) and determines that the amount of errors contained in the first copy of the operational information exceeds a tolerable threshold (operation 612), controller 102 may retrieve a second copy of operational information of memory array 104, if available, from the non-volatile memory section 110 ("yes" branch from operation 614 to operation 610), and use corresponding error detection codes to determine whether the amount of errors contained in the second copy of operational information exceeds the tolerable threshold. In some embodiments, controller 102 may iteratively perform the similar operation until the amount of errors contained in a copy of the operational information does not exceed the tolerable threshold.

In response to controller 102 retrieving all the available copies of operational information stored in non-volatile memory section 110 or 120 and determining that none of the retrieved copies stored in non-volatile memory section 110 or 120 passes the criteria ("no" branch from operation 614), the method 600 proceeds to operation 618 to determine whether both sets of non-volatile memory cells have been used. If so, the method 600 proceeds to operation 620; and if not, the method 600 proceeds back to operation 604.

In response to determining that the amount of errors contained in at least one copy of the operational information stored in non-volatile memory section 110 or 120 does not exceed the tolerable threshold ("yes" branch from operation 612), the method 600 proceeds to operation 616 to operate the memory array. In response to determining that both sets of non-volatile memory cells have been used and none of the retrieved copies stored in either the non-volatile memory section 110 or non-volatile memory section 120 passes the criteria ("yes" branch from operation 618), the method 600 proceeds to operation 620 to determine that the second wake-up operation as failed.

In some embodiments, subsequent to operation 616, the method 600 may proceed to operation 622 (FIG. 6B) in which one or more additional wake-up operations may be performed on the memory array.

For example, subsequent to operation 616, memory array 104 may perform one or more read or write operations as requested by host 106. In some cases, where host 106 does not request memory array 104 to perform certain active operations (read or write operations) for a certain period of time, memory array 104 may spontaneously or responsively (to host 106) transition to a low-power state or power-off state. As such, when host 106 requests memory array 104 to perform another active function, a second wake-up operation may be initiated to perform on memory array 104. In another example, subsequent to operation 620, in response to the first wake-up operation being determined as failed, host 106 may send a command to controller 102 to perform a second wake-up operation on memory array 104 or controller 102 may automatically perform a second wake-up operation on memory array 104.

The method 600 continues to operation 624 in which another command indicative of a second set of non-volatile memory cells is received, which is similar to operation 604. In some embodiments, the command in operation 624 may include a different indication from the indication of command received in operation 404. In other words, the command received in operation 624 may include an indication (e.g., an address, an associated signal, a flag, and/or an identification of non-volatile memory section 120) to designate non-volatile memory section 120 while the indication of the command received in operation 604 designates non-volatile memory section 110. As such, in operation 624, controller 102 may deterministically select non-volatile memory section 120.

Next, the method 600 continues to operation 628 to determine whether a number of failed wake-up operations using the one or more copies of operational information stored in the selected set of non-volatile memory cells exceeds a pre-defined threshold. If not, the method 600 proceeds to operation 630 in which a copy of operational information stored is retrieved from the selected set of non-volatile memory cells; and if so, the method 600 proceeds to operation 632 in which a copy of operational information stored is retrieved from the non-selected set of non-volatile memory cells.

Continuing with the above example where controller randomly selects non-volatile memory section 120 at operation 624, controller 102 may count the number of previous failed wake-up operations using the one or more copies of operational information stored in non-volatile memory section 120. In some embodiments, controller 102 may include a counter circuit to dynamically count, record, or otherwise manage the success or failure of each of the previously performed wake-up operations. Further, controller 102 may count, record, or otherwise manage which of the non-volatile memory sections is retrieved to render the success or failure of each of the previously performed wake-up operations. Controller 102 can then compare the counted number with a pre-defined threshold. In response to determining that the number of failed wake-up operations using the one or more copies of the operational information stored in non-volatile memory section 120 exceeds the threshold, controller 102 may select the other non-volatile memory section, 110 in the current example, to retrieve the one or more copies of operational information stored therein. However, in response to determining that the number of failed wake-up operations using the one or more copies of the operational information stored in non-volatile memory section 120 does not exceed the threshold, controller 102 may remain the selection of non-volatile memory section 120 to retrieve the one or more copies of operational information stored therein.

The method 600 proceeds to operation 634 in which the controller may use one or more error detection techniques to determine whether the retrieved operational information passes a predefined criterion. Operation 634 is substantially similar to operation 612. For example, the method 600 proceeds to operation 636 to check whether one or more additional copies of operational information are available in the selected or non-selected set of non-volatile memory cells.

In the above example, when controller 102 retrieves a first copy of operational information of memory array 104 from non-volatile memory section 120 (operation 630) and determines that the amount of errors contained in the first copy of the operational information exceeds a tolerable threshold (operation 634), controller 102 may retrieve a second copy of operational information of memory array 104, if available, from the selected non-volatile memory section 120 ("yes" branch from operation 636 to operation 630), and use corresponding error detection codes to determine whether the amount of errors contained in the second copy of operational information exceeds the tolerable threshold. In some embodiments, controller 102 may iteratively perform the similar operation until the amount of errors contained in a copy of the operational information does not exceed the tolerable threshold.

Similarly, when controller 102 retrieves a first copy of operational information of memory array 104 from non-volatile memory section 110 (operation 632) and determines that the amount of errors contained in the first copy of the operational information exceeds a tolerable threshold (operation 634), controller 102 may retrieve a second copy of operational information of memory array 104, if available, from the non-volatile memory section 110 ("yes" branch from operation 636 to operation 632), and use corresponding error detection codes to determine whether the amount of errors contained in the second copy of operational information exceeds the tolerable threshold. In some embodiments, controller 102 may iteratively perform the similar operation until the amount of errors contained in a copy of the operational information does not exceed the tolerable threshold.

In response to controller 102 retrieving all the available copies of operational information stored in non-volatile memory section 110 or 120 and determining that none of the retrieved copies stored in non-volatile memory section 110 or 120 passes the criteria ("no" branch from operation 636), the method 600 proceeds to operation 640 to determine whether both sets of non-volatile memory cells have been used. If so, the method 600 proceeds to operation 642; and if not, the method proceeds back to operation 624.

In some embodiments, operation 638 and operation 642 are substantially similar to operations 616 and 620, respectively. Thus, operations 638 and 642 are briefly described as follows. In response to determining that the amount of errors contained in at least one copy of the operational information stored in non-volatile memory section 110 or 120 does not exceed the tolerable threshold ("yes" branch from operation 634), the method 600 proceeds to operation 638 to operate the memory array. In response to determining that both sets of non-volatile memory cells have been used and none of the retrieved copies stored in either the non-volatile memory section 110 or non-volatile memory section 120 passes the criteria ("yes" branch from operation 640), the method 600 proceeds to operation 642 to determine that the second wake-up operation as failed. In some embodiments, subsequent to operation 638, the method 600 may proceed to operation 644 in which one or more additional wake-up operations may be performed on the memory array.

The preceding description is directed to certain implementations for the purposes of describing the innovative aspects of this disclosure. However, a person having ordinary skill in the art will readily recognize that the teachings herein can be applied in a multitude of different ways. The described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, printers, copiers, scanners, facsimile devices, global positioning system (GPS) receivers/navigators, cameras, digital media players (such as MP3 players), camcorders, game consoles, wrist watches, wearable devices, clocks, calculators, television monitors, flat panel displays, electronic reading devices (such as e-readers), computer monitors, auto displays (such as odometer and speedometer displays), cockpit controls and displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS) applications including microelectromechanical systems (MEMS) applications, in addition to non-EMS applications), aesthetic structures (such as display of images on a piece of jewelry or clothing) and a variety of EMS devices.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm processes described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and processes described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a number of microprocessors, one or more microprocessors in conjunction with a DSP core, or any other such configuration. In some implementations, particular processes and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Additionally, a person having ordinary skill in the art will readily appreciate, directional terms are sometimes used for ease of describing the figures, and indicate relative positions corresponding to the orientation of the figure on a properly oriented page, and may not reflect the proper orientation of any device as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. A device, comprising:
   a memory array;
   a plurality of non-volatile memory sections configured to each store a copy of operational information for the memory array; and
   a controller coupled to the plurality of non-volatile memory sections, the controller configured to:
      select a first non-volatile memory section to retrieve the copy of operational information in connection with a first wake-up operation; and
      select a second non-volatile memory section to retrieve the copy of operational information in connection with a second wake-up operation,
   wherein the controller is configured to make the selections without regard to success or failure of a prior attempt to retrieve the copy of operational information.

2. The device of claim 1, wherein the controller is configured to switch between selection of the first non-volatile memory section and the second non-volatile memory sections for each successive wake-up operation.

3. The device of claim 1, wherein the wake-up operation transitions the memory array out of at least one of a power-saving state and a power-off state.

4. The device of claim 1, wherein the controller is further configured to deterministically select one of the first non-volatile memory section and the second non-volatile memory section in response to receiving a plane address that designates the one of the first non-volatile memory section and the second non-volatile memory section.

5. The device of claim 1, wherein the controller is further configured to randomly select the first non-volatile memory section and the second non-volatile memory section from the plurality of non-volatile memory sections in connection with the first and second wake-up operations, respectively.

6. The device of claim 1, wherein the first non-volatile memory section and second non-volatile memory section each include a plurality of one-time-programmable memory cells.

7. The device of claim 1, wherein the operational information indicates at least one of a bad column of the memory array, a bad block of the memory array, and an operating parameter of the memory array.

8. The device of claim 1, wherein the controller is further configured to proactively switch between selection of the first non-volatile memory section and the second non-volatile memory section in connection with a wake-up operation to increase speed and decrease latency of operation of the memory array.

9. The device of claim 1, wherein the controller is further configured to:
   count a number of wake-up operations using the copy of operational information stored in the first non-volatile memory section that fail to transition the memory array out of a low-power state; and
   select the second non-volatile memory section in connection with a wake-up operation in response to determining that the number of wake-up operations satisfies a predefined threshold.

10. A method, comprising:
  receiving a command to transition a memory array out of a low-power state to a higher power state, wherein the command includes an indication of a first set of non-volatile memory cells;
  retrieving operational information of the memory array from the first set of non-volatile memory cells information based on the indication; and
  using the retrieved operational information stored in the first set of non-volatile memory cells to access the memory array,
  wherein the indication is determined without regard to success or failure of a prior attempt to retrieve the operational information.

11. The method of claim 10, wherein the indication comprises a plane address that designates the first set of non-volatile memory cells, and wherein the method further comprises selecting the first set of non-volatile memory cells according to the plane address.

12. The method of claim 10, further comprising:
  receiving a second command to transition the memory array out of another low-power state, wherein the second command indicates a second, different set of non-volatile memory cells;
  responsive to the second command, retrieving operational information from the second, different set of non-volatile memory cells; and
  using the retrieved operational information stored in the second, different set of non-volatile memory cells to access the memory array.

13. The method of claim 12, further comprising:
  receiving a plurality of successive commands to transition the memory array out of respective low-power states, wherein each of the plurality of commands indicates either the first or the second, different set of non-volatile memory cells;
  retrieving the operational information of the memory array from either the first or the second, different set of non-volatile memory cells according to the plurality of successive commands; and
  using the selected operational information stored in either the first set of non-volatile memory cells or the second, different second set of non-volatile memory cells to access the memory array.

14. A device, comprising:
  a non-volatile memory array;
  a first fuse memory section and a second fuse memory section, each configured to store a copy of operational information of the non-volatile memory array;
  a selector configured to toggle between the first fuse memory section and the second fuse memory section in successive wake-up operations to select one of the first fuse memory section and the second fuse memory section; and
  a controller coupled to the selector, the controller configured to retrieve the respective copy of operational information from the selected one of the first fuse memory section and the second fuse memory section without regard to success or failure of a prior attempt to retrieve the respective copy of operational information.

15. The device of claim 14, wherein the selector is further configured to:
  select the first fuse memory section in response to operating the non-volatile memory array in a first wake-up operation of the successive wake-up operations; and
  switch to the second fuse memory section in response to operating the non-volatile memory array in a second successive wake-up operation of the successive wake-up operations.

16. The device of claim 14, wherein the selector is further configured to select one of the first fuse memory section or the second fuse memory section in response to receiving a plane address that designates the one of the first fuse memory section or the second fuse memory section.

17. The device of claim 14, wherein the operational information indicates at least one of a bad column of the non-volatile memory array, a bad block of the non-volatile memory array, and an operating parameter of the non-volatile memory array.

18. The device of claim 17, wherein the controller is further configured to load the copy of operational information stored in either the first fuse memory section or the second fuse memory section into a register circuit to isolate an indicated bad block of the non-volatile memory array from being accessed.

19. The device of claim 17, wherein the controller is further configured to load the copy of operational information stored in either the first fuse memory section or the second fuse memory section into a register circuit to replace an indicated bad column of the non-volatile memory array with a corresponding replacement column of the non-volatile memory array.

20. The device of claim 17, wherein the controller is further configured to load the copy of operational information stored in either the first fuse memory section or the second fuse memory section into a register circuit to provide a trimmed voltage to operate the non-volatile memory array.

\* \* \* \* \*